US012707822B2

(12) United States Patent
Wang et al.

(10) Patent No.: US 12,707,822 B2
(45) Date of Patent: Aug. 11, 2026

(54) DISPLAY APPARATUS, AND DISPLAY PANEL AND MANUFACTURING METHOD THEREFOR

(71) Applicant: BOE Technology Group Co., Ltd., Beijing (CN)

(72) Inventors: Yawei Wang, Beijing (CN); Chuanxiang Xu, Beijing (CN); Zhenyu Zhang, Beijing (CN); Ming Yang, Beijing (CN); Fuqiang Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 405 days.

(21) Appl. No.: 18/280,473

(22) PCT Filed: Nov. 18, 2021

(86) PCT No.: PCT/CN2021/131433
§ 371 (c)(1),
(2) Date: Sep. 6, 2023

(87) PCT Pub. No.: WO2022/188459
PCT Pub. Date: Sep. 15, 2022

(65) Prior Publication Data

US 2024/0155875 A1 May 9, 2024

(30) Foreign Application Priority Data

Mar. 8, 2021 (CN) ........................ 202110251290.7

(51) Int. Cl.
*H10K 59/122* (2023.01)
*H10K 59/12* (2023.01)
*H10K 59/38* (2023.01)

(52) U.S. Cl.
CPC ....... *H10K 59/122* (2023.02); *H10K 59/1201* (2023.02); *H10K 59/38* (2023.02)

(58) Field of Classification Search
CPC .. H10K 59/122; H10K 59/1201; H10K 59/38; H10K 59/65; H10K 59/865; H10K 71/00
See application file for complete search history.

(56) References Cited

U.S. PATENT DOCUMENTS 10,685,202 B2 6/2020 Kim et al.
2018/0089491 A1 3/2018 Kim et al.
(Continued)

FOREIGN PATENT DOCUMENTS

CN 109148528 A 1/2019
CN 111129102 A 5/2020
(Continued)

OTHER PUBLICATIONS

International Search Report and Written Opinion mailed on Feb. 16, 2022, in corresponding PCT/CN2021/131433, 8 pages.
(Continued)

*Primary Examiner* — Anne M Hines
*Assistant Examiner* — Jose M Diaz
(74) *Attorney, Agent, or Firm* — XSENSUS LLP

(57) ABSTRACT

A display panel includes a driving backplane, provided with a display area including a first sub-area and a second sub-area; a light-emitting layer, located at one side of the driving backplane, and including a pixel definition layer and a plurality of light-emitting devices, the pixel definition layer is provided with a plurality of first light-transmitting holes located in the second sub-area; and a color film layer, located at one side of the light-emitting layer away from the driving backplane, and including a light-shielding portion and a plurality of light-filtering portions separated by the light-shielding portion, the light-filtering portions and the
(Continued)

light-emitting devices are arranged in one-to-one correspondence in a direction perpendicular to the driving backplane, the light-shielding portion is provided with a plurality of second light-transmitting holes, and the second light-transmitting holes and the first light-transmitting holes are arranged in one-to-one correspondence in the direction perpendicular to the driving backplane.

19 Claims, 4 Drawing Sheets

(56) References Cited

U.S. PATENT DOCUMENTS

| | | | | |
|---|---|---|---|---|
| 2020/0311374 | A1 | 10/2020 | Kim et al. | |
| 2021/0202621 | A1 | 7/2021 | Liang et al. | |
| 2023/0057334 | A1* | 2/2023 | Yang | H10K 59/38 |
| 2024/0298480 | A1* | 9/2024 | Zhang | H10K 59/126 |

FOREIGN PATENT DOCUMENTS

| | | | |
|---|---|---|---|
| CN | 111312792 | A | 6/2020 |
| CN | 111863900 | A | 10/2020 |
| CN | 113035921 | A | 6/2021 |
| EP | 3306526 | A2 | 4/2018 |

OTHER PUBLICATIONS

Office Action issued on Feb. 11, 2023, in corresponding Chinese patent Application No. 202110251290.7, 17 pages.

Office Action issued on Aug. 23, 2023, in corresponding Chinese patent Application No. 202110251290.7, 15 pages.

* cited by examiner 20
200R-200
200B-200
200G-200
212
211R-211
211B-211
211G-211

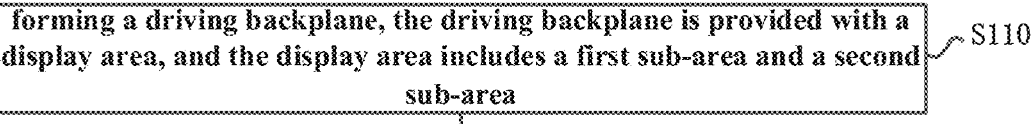

forming a light-emitting layer at one side of the driving backplane, the light-emitting layer includes a pixel definition layer and a plurality of light-emitting devices separated by the pixel definition layer, the pixel definition layer covers the first sub-area and the second sub-area, and respective ones of the light-emitting devices are distributed in the first sub-area and the second sub-area; and the pixel definition layer is made of a light-shielding material and provided with a plurality of first light-transmitting holes located in the second sub-area

S120 forming a color film layer at one side of the light-emitting layer away from the driving backplane, the color film layer includes a light-shielding portion and a plurality of light-filtering portions separated by the light-shielding portion; the light-filtering portions and the light-emitting devices are arranged in one-to-one correspondence in a direction perpendicular to the driving backplane; the light-shielding portion is provided with a plurality of second light-transmitting holes, and the second light-transmitting holes and the first light-transmitting holes are arranged in one-to-one correspondence in a direction perpendicular to the driving backplane

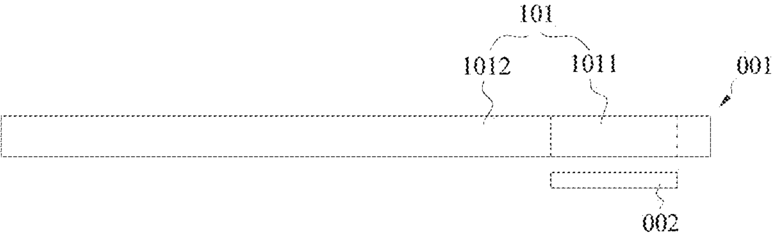

FIG. 8

DISPLAY APPARATUS, AND DISPLAY PANEL AND MANUFACTURING METHOD THEREFOR

CROSS-REFERENCE TO RELATED APPLICATIONS

The present application is the U.S. National Stage of International Application No. PCT/CN2021/131433, filed on Nov. 18, 2021, which claims the priority to the Chinese Patent Application No. 202110251290.7, entitled "DISPLAY APPARATUS, AND DISPLAY PANEL AND MANUFACTURING METHOD THEREFOR", filed on Mar. 8, 2021, the contents of each of which are incorporated herein by reference in their entireties.

TECHNICAL FIELD

The present disclosure relates to the field of display technology, and in particular to a display apparatus, a display panel and a manufacturing method therefor.

BACKGROUND

Currently, in electronic devices such as cellular phones and tablet computers, in order to avoid a display panel from blocking an imaging device and to ensure that the imaging device can normally capture images, the imaging device is usually provided outside of a display area of the display panel, but this will result in a larger width of a frame; and of course, a light-transmitting hole for the imaging device to capture images can be provided in the display area of the display panel, but this will take up an area of the display area.

It is to be noted that the information disclosed in the above background section is only intended to enhance an understanding of the background of the present disclosure, and thus may include information that does not constitute prior art known to those ordinary skilled in the art.

SUMMARY

An object of the present disclosure is to provide a display apparatus, a display panel and a manufacturing method therefor.

According to an aspect of the present disclosure, a display panel is provided and includes:

- a driving backplane, provided with a display area; the display area includes a first sub-area and a second sub-area;
- a light-emitting layer, located at one side of the driving backplane, and including a pixel definition layer and a plurality of light-emitting devices separated by the pixel definition layer; the pixel definition layer covers the first sub-area and the second sub-area; the light-emitting devices are distributed in the first sub-area and the second sub-area, and the pixel definition layer is made of a light-shielding material and provided with a plurality of first light-transmitting holes located in the second sub-area; and
- a color film layer, located at one side of the light-emitting layer away from the driving backplane, and including a light-shielding portion and a plurality of light-filtering portions separated by the light-shielding portion; the light-filtering portions and the light-emitting devices are arranged in one-to-one correspondence in a direction perpendicular to the driving backplane; the light-shielding portion is provided with a plurality of second light-transmitting holes, and the second light-transmitting holes and the first light-transmitting holes are arranged in one-to-one correspondence in the direction perpendicular to the driving backplane.

In an embodiment of the present disclosure, the display panel includes a plurality of device groups, and each of the device groups includes more than one of the light-emitting devices; and at least one of the device groups in the second sub-area is surrounded by more than one of the first light-transmitting holes.

In an embodiment of the present disclosure, an outline of an orthographic projection of the first light-transmitting hole on the driving backplane is a smooth closed curve.

In an embodiment of the present disclosure, the outline of the orthographic projection of the first light-transmitting hole on the driving backplane is any one of a circle, an oval, or a capsular shape.

In an embodiment of the present disclosure, an outline of an orthographic projection of the second light-transmitting hole on the driving backplane is in a same shape as an outline of an orthographic projection of the first light-transmitting hole on the driving backplane.

In an embodiment of the present disclosure, an orthographic projection, on the driving backplane, of any one of the first light-transmitting holes is located within an orthographic projection, on the driving backplane, of a corresponding one of the second light-transmitting holes.

In an embodiment of the present disclosure, the light-emitting device includes:

- a first electrode, located at one side of the driving backplane close to the color film layer; the pixel definition layer is provided with an opening exposing the first electrode;
- a light-emitting functional layer, at least partially located in the opening and located on a surface of the first electrode away from the driving backplane; and
- a second electrode, located on a surface of the light-emitting functional layer away from the driving backplane.

In an embodiment of the present disclosure, the second electrode is a continuous electrically conductive layer covering the light-emitting functional layer and the pixel definition layer, the light-emitting devices share the same second electrode, and an area of the second electrode corresponding to the first light-transmitting hole is recessed into the first light-transmitting hole.

In an embodiment of the present disclosure, an outline of an orthographic projection, on the driving backplane, of the opening in the first sub-area is a polygon, and an outline of an orthographic projection, on the driving backplane, of the opening in the second sub-area is a smooth closed curve.

In an embodiment of the present disclosure, the driving backplane includes a plurality of first pixel circuits and a plurality of second pixel circuits located in the first sub-area; and

- respective ones of the first pixel circuits are connected in one-to-one correspondence to respective ones of the light-emitting devices located in the first sub-area, and respective ones of the second pixel circuits are connected in one-to-one correspondence to respective ones of the light-emitting devices located in the second sub-area.

In an embodiment of the present disclosure, the device group includes a first light-emitting device, a second light-emitting device, and two third light-emitting devices; the opening includes a first opening corresponding to the first light-emitting device, a second opening corresponding to the second light-emitting device, and a third opening corresponding to the third light-emitting device; the first opening is larger than the second opening, and the second opening is larger than the third opening, and the light-filtering portion includes a first light-filtering portion corresponding to the first light-emitting device, a second light-filtering portion corresponding to the second light-emitting device, and a third light-filtering portion corresponding to the third light-emitting device; a color of the first light-filtering portion is red, a color of the second light-filtering portion is blue, and a color of the third light-filtering portion is green.

In an embodiment of the present disclosure, the display panel further includes:

an encapsulation layer, covering a surface of the light-emitting layer away from the driving backplane; and a touch layer, located at one side of the encapsulation layer away from the driving backplane;

the color film layer is located at one side of the touch layer away from the driving backplane.

According to an aspect of the present disclosure, a manufacturing method for a display panel is provided and includes:

forming a driving backplane, the driving backplane is provided with a display area, and the display area includes a first sub-area and a second sub-area forming a light-emitting layer at one side of the driving backplane, the light-emitting layer includes a pixel definition layer and a plurality of light-emitting devices separated by the pixel definition layer, the pixel definition layer covers the first sub-area and the second sub-area, and respective ones of the light-emitting devices are distributed in the first sub-area and the second sub-area; and the pixel definition layer is made of a light-shielding material and provided with a plurality of first light-transmitting holes located in the second sub-area; and forming a color film layer at one side of the light-emitting layer away from the driving backplane, the color film layer includes a light-shielding portion and a plurality of light-filtering portions separated by the light-shielding portion; the light-filtering portions and the light-emitting devices are arranged in one-to-one correspondence in a direction perpendicular to the driving backplane; the light-shielding portion is provided with a plurality of second light-transmitting holes, and the second light-transmitting holes and the first light-transmitting holes are arranged in one-to-one correspondence in a direction perpendicular to the driving backplane.

According to an aspect of the present disclosure, a display apparatus is provided and includes the display panel according to any one of the above.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the present disclosure and together with the description serve to explain the principles of the present disclosure. Apparently, the drawings in the following description are only some embodiments of the present disclosure, and those skilled in the art can obtain other drawings according to these drawings without creative efforts.

FIG. 7 is a flowchart of a manufacturing method for a display panel according to an embodiment of the present disclosure.

FIG. 8 is a schematic diagram of a display apparatus according to an embodiment of the present disclosure.

Figures 1, 2:
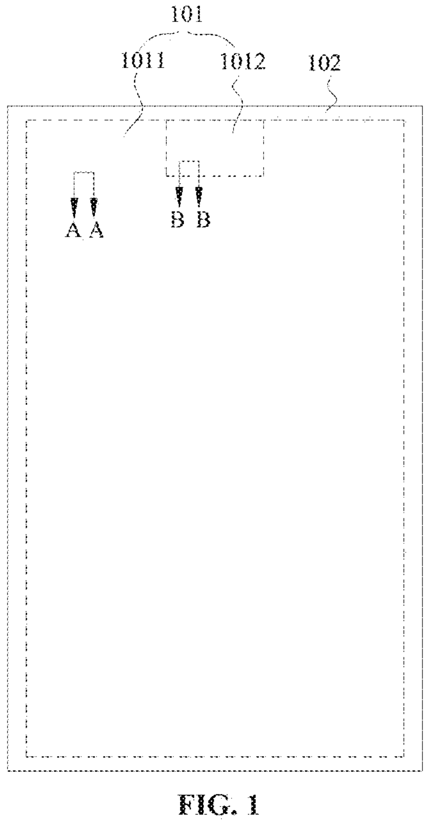
FIG. 1 is a top view of a display panel according to an embodiment of the present disclosure.
FIG. 2 is a cross-sectional view along A-A of the display panel in FIG. 1.

1—driving backplane; 101—display area; 1011—first sub-area 1012—second sub-area; 102—peripheral area, 110—substrate; 111—active layer; 112—first gate insulation layer; 113—gate; 114—second gate insulation layer; 115—interlayer dielectric layer; 116—first source-drain layer; 116S—source; 116D—drain; 117—passivation layer; 118—first planarization layer; 119—second source-drain layer; 120—second planarization layer;

2—light-emitting layer; 21—pixel definition layer; 211—opening; 211R—first opening; 2111B—second opening; 211G—third opening; 212—first light-transmitting hole; 22—first electrode; 23—light-emitting functional layer; 24—second electrode; 20—device group; 200—light-emitting device; 200R—first light-emitting device; 200B—second light-emitting device; 2000—third light-emitting device;

3—color film layer; 31—light-shielding portion; 311—open hole; 312—second light-transmitting hole; 32—light-filtering portion; 32R—first light-filtering portion; 32B—second light-filtering portion; 32G—third light-filtering portion;

4—encapsulation layer;

5—touch layer;

6—transparent cover;

7—support column;

001—display panel;

002—imaging device.

DETAILED DESCRIPTION

Exemplary embodiments will now be described more fully with reference to the accompanying drawings. Exemplary embodiments may, however, be implemented in many forms and should not be construed as limited to the embodiments set forth herein. Instead, these embodiments are provided so that the present disclosure will be thorough and complete, and will fully convey the concept of exemplary embodiments to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

The terms "a". "an", "the". "said", and "at least one" are used to indicate the presence of one or more elements/components and the like. The terms "include" and "have" are used to indicate a non-exclusive inclusion and mean that there may be additional elements/components and the like in addition to the listed elements/components and the like. The terms "first", "second", "third" and the like are only used as markers, without limiting the number of objects related thereto.

An embodiment of the present disclosure provides a display panel. The display panel may be an organic light-emitting diode (OLED) display panel.

The following describes the manner in which the display panel of the present disclosure realizes image display.

Figures 3, 4:
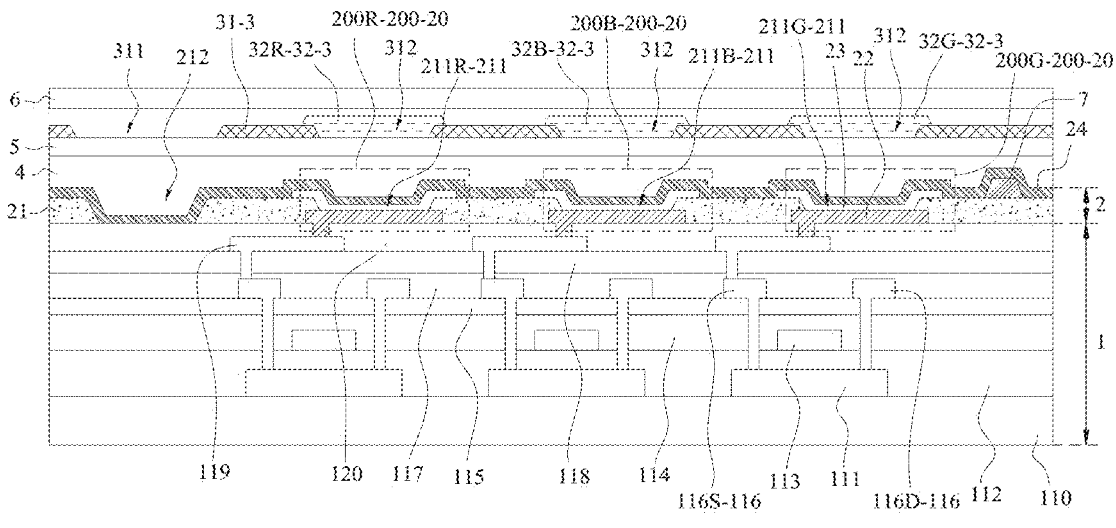
FIG. 3 is a cross-sectional view along B-B of the display panel in FIG. 1.
FIG. 4 is a schematic distribution diagram of a device group and first light-transmitting holes of a display panel according to an embodiment of the present disclosure.

As shown in FIGS. 1-3, the display panel may include a driving backplane 1, a light-emitting layer 2, and a color film layer 3.

The driving backplane 1 is provided with a driving circuit. The light-emitting layer 2 includes a plurality of light-emitting devices 200, and each of the light-emitting devices 200 of the light-emitting layer 2 may be driven to emit light by the driving circuit. Specifically, the driving backplane 1 may include a display area 101 and a peripheral area 102 located outside the display area 101. The display area 101 is used for displaying an image. The driving circuit may include a pixel circuit and a peripheral circuit. The pixel circuit is located in the display area 101, and may be a pixel circuit such as 7T1C, 7T2C, 6T1C, or 6T2C, as long as it is capable of driving the light-emitting device 200 to emit light, and no special limitations are made to its structure herein. The number of the pixel circuit is the same as the number of the light-emitting device 200. Respective ones of the pixel circuits are connected in one-to-one correspondence to respective ones of the light-emitting devices 200 so as to control each of the light-emitting devices 200 to emit light respectively. In this embodiment, nTmC indicates that a pixel circuit includes n transistors (denoted by the letter "T") and m capacitors (denoted by the letter "C").

The peripheral circuit is located in the peripheral area 102, and is connected to the pixel circuit for inputting a driving signal to the pixel circuit so as to control the light-emitting device 200 to emit light. The peripheral circuit may include a gate driving circuit and a light-emitting control circuit. Of course, the peripheral circuit may further include other circuits, and the specific structure of the peripheral circuit is not specifically limited herein.

As shown in FIGS. 2 and 3, the driving backplane 1 may be formed by a plurality of film layers. For example, the driving backplane 1 may include a substrate 110 and a driving layer located at one side of the substrate 110. The substrate 110 may be a single-layer or a multi-layer structure, and it may be a rigid or flexible structure, and no special limitations are made herein. The above-described driving circuit may be located in the driving layer, and taking the transistor in the driving circuit as a top gate thin film transistor as an example, the driving layer may include an active layer 111, a first gate insulation layer 112, a gate 113, a second gate insulation layer 114, an interlayer dielectric layer 115, a first source-drain layer 116, a passivation layer 117, a first planarization layer 118, a second source-drain layer 119, and a second planarization layer 120.

In this example, the active layer 1 is located on the substrate 110; the first gate insulation layer 112 covers the active layer 111; the gate 113 is located on a surface of the first gate insulation layer 112 away from the substrate 110 and is located opposite to the active layer 111; the second gate insulation layer 114 covers the gate 113 and the first gate insulation layer 112; the interlayer dielectric layer 115 covers the second gate insulation layer 114; and the first source-drain layer 116 is located on a surface of the interlayer dielectric layer 115 away from the substrate 110 and includes a source 116S and a drain 116D, the source 116S and the drain 116D are connected to the active layer 111; the passivation layer 117 covers the first source-drain layer 116; the first planarization layer 118 covers the passivation layer 117; the second source-drain layer 119 is located on a surface of the first planarization layer 118 away from the substrate 110 and is connected to the first source-drain layer 116; and the second planarization layer 120 covers the second source-drain layer 119 and the first planarization layer 118.

As shown in FIGS. 2 and 3, the light-emitting layer 2 is located at one side of the driving backplane 1 close to the color film layer 3. For example, the light-emitting layer 2 is located on a surface of the driving layer away from the substrate 110. The light-emitting layer 2 may include a pixel definition layer 21 and a plurality of light-emitting devices 200 distributed in arrays in the display area 101.

Figure 5:
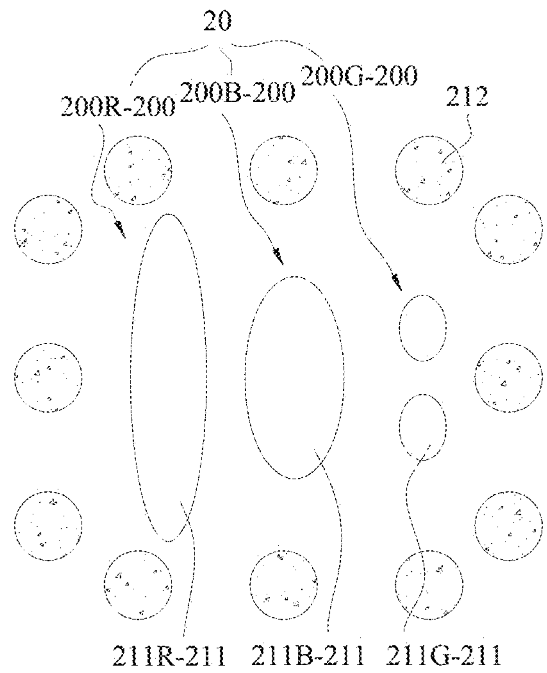
FIG. 5 is a schematic distribution diagram of a device group and first light-transmitting holes of a display panel according to another embodiment of the present disclosure.
Figure 6:
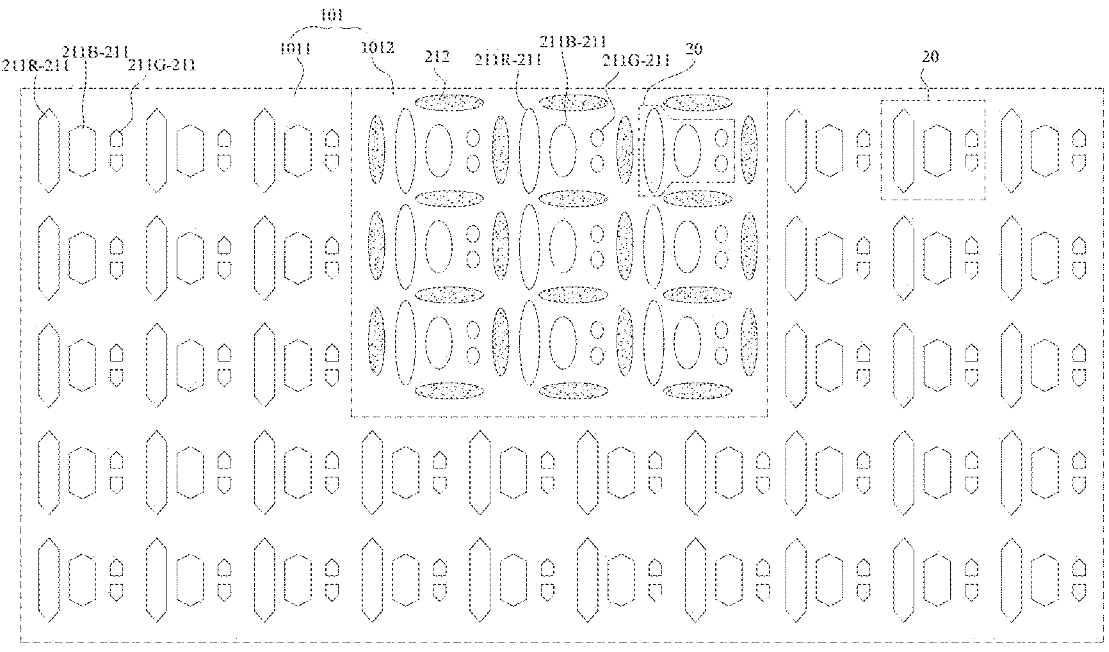
FIG. 6 is a schematic distribution diagram of openings and first light-transmitting holes of a display panel according to an embodiment of the present disclosure.

The pixel definition layer 21 may be located at one side of the driving backplane 1. For example, the pixel definition layer 21 is located on a surface of the second planarization layer 120 away from the substrate 110. The pixel definition layer 21 is used for separating respective ones of the light-emitting devices 200. Specifically, the pixel definition layer 21 may be provided with a plurality of openings 211, each of the openings 211 defines a range of a light-emitting device 200. The shape of the opening 211, that is, an outline of an orthographic projection, on the driving backplane 1, of the opening 211 may be a polygon, a smooth closed curve, or other shapes. The smooth closed curve may be a circle (as shown in FIG. 5), an oval (as shown in FIG. 6), or a capsular shape, etc., and no special limitations are made herein.

The light-emitting devices 200 may be connected in one-to-one correspondence to respective ones of the pixel circuits, thereby emitting light under the driving of the driving circuit. For example, the light-emitting device 200 may be connected to the second source-drain layer 119 and emit light under the driving of the driving circuit. Taking the light-emitting device 200 as an OLED light-emitting device 200 as an example, the light-emitting device 200 may include a first electrode 22, a light-emitting functional layer 23, and a second electrode 24 successively stacked in a direction away from the driving backplane 1.

The first electrode 22 may be located on the same surface of the driving backplane 1 as the pixel definition layer 21, and may serve as an anode of the OLED light-emitting device 200. An outline of an orthographic projection of the first electrode 22 on the driving backplane 1 may be a polygon, a smooth curve, or other shapes. Respective ones the openings 211 of the pixel definition layer 21 exposes respective ones of the first electrodes 22 in one-to-one correspondence, and each of the openings 211 is not larger than the first electrode 22 it exposes. That is to say, a range of any one of the openings 211 is within a boundary of a corresponding first electrode 22. The first electrode 22 may be a single-layer or a multi-layer structure. The material of the first electrode 22 may include one or more of conductive metals, metal oxides, or alloys.

The light-emitting functional layer 23 is at least partially located in the opening 211, and may include a hole injection layer, a hole transport layer, a light-emitting material layer, an electron transport layer, and an electron injection layer successively stacked in a direction away from the driving backplane 1. Holes and electrons may be combined into excitons in the light-emitting material layer, and the excitons emit photons, thereby generating visible light. The specific light-emitting principle will not be detailed here.

Furthermore, as shown in FIG. 2 and FIG. 3, light-emitting functional layers 23 of respective ones of the light-emitting devices 200 may be independent of each other, and may be distributed in an array in respective ones of the openings 211. That is to say, the light-emitting functional layers 23 of different light-emitting devices 200 are independent of each other.

Of course, the light-emitting functional layers 23 of respective ones of the light-emitting devices 200 may also share at least a part of the film layers 23 of the light-emitting functional layers 23, thereby reducing process difficulty. For example, in some embodiments of the present disclosure, respective ones of the light-emitting devices 200 may share at least one of the hole injection layer, the hole transport layer, the electron transport layer, or the electron injection layer; the number of the light-emitting material layers is multiple, and the light-emitting material layers are located in one-to-one correspondence in respective ones of the openings 211. In this embodiment, colors of the light-emitting devices 200 may be the same color. In this case, it is necessary to cooperate with the filtering function of the color film layer 3 to achieve color display. Of course, since the light-emitting material layers of respective ones of the light-emitting devices 200 are independent of each other, different light-emitting devices 200 may also be made to emit different colors of light.

The second electrode 24 may cover the light-emitting functional layer 23, and may serve as a cathode of the OLED light-emitting device 200. The second electrode 24 may be a single-layer or a multi-layer structure. The material of the second electrode 24 may include one or more of conductive metals, metal oxides, or alloys.

Furthermore, as shown in FIG. 2 and FIG. 3, respective ones of the light-emitting devices 200 may share the same second electrode 24. Specifically, the second electrode 24 is a continuous electrically conductive layer covering the pixel definition layer 21 and the light-emitting functional layers 23 of respective ones of the light-emitting devices 2(*x*). That is to say, an orthographic projection of the second electrode 24 on the pixel definition layer 21 covers respective ones of the openings 211. Meanwhile, the thickness of the second electrode 24 is smaller than the thickness of the pixel definition layer 21. An area of the second electrode 24 corresponding to the first light-transmitting hole 212 is recessed into the first light-transmitting hole 212, that is, the area of the second electrode 24 corresponding to the first light-transmitting hole 212 is recessed along a side wall of the first light-transmitting hole 212 towards a direction close to the driving backplane 1, and covers the side wall and bottom surface of the first light-transmitting hole 212.

As shown in FIG. 2 and FIG. 3, the color film layer 3 is located at one side of the light-emitting layer 2 away from the driving backplane 1, and includes a light-shielding portion 31 and a plurality of light-filtering portions 32 separated by the light-shielding portion 31.

The light-shielding portion 31 may be made of a light-shielding material, for example, the material of the light-shielding portion 31 may include black resin. The light-shielding portion 31 may be provided with open holes 311, and the open holes 311 and the openings 211 are arranged in one-to-one correspondence. For example, centerlines of respective ones of the open holes 311 are collinear in one-to-one correspondence with centerlines of respective ones of the openings 211, and an orthographic projection, on the driving backplane 1, of an opening 211 is located within an orthographic projection, on the driving backplane 1, of a corresponding one of the open holes 311, that is, the open hole 311 is not smaller than its corresponding opening 211, to avoid blocking the light emitted by the light-emitting device 200 due to the small size of the open hole 311.

The light-filtering portions 32 may be made of a light-filtering material. Each of the light-filtering portions 32 allows only one color of light to pass through. Meanwhile, respective ones of the light-filtering portions 32 are arranged in one-to-one correspondence in respective ones of the open holes 311, thereby being separated by the light-shielding portion 31. Respective ones of the light-filtering portions 32 and the light-emitting devices 200 are arranged in one-to-one correspondence in a direction perpendicular to the driving backplane 1, causing that the light emitted by the light-emitting device 200 may be emitted through the corresponding light-filtering portion 32. Each of the light-emitting devices 200 and the corresponding light-filtering portion 32 may form a light-emitting unit. The light-emitting unit may emit a monochromatic light, such as red, blue, or green. Of course, the light-emitting unit may also emit a white light, and in this case the light-filtering portion 32 may be made of a transparent material.

The above-described light-filtering portion 32 may filter out most of the bands of the light entering the display panel from the outside, thereby achieving the effect of reducing reflection and not completely blocking the light emitted by the light-emitting device 200, so that the image is displayed normally. Therefore, the polarizer used for reducing the reflection may be replaced by the color film layer 3. Due to process and structural reasons, the thickness of the polarizer is usually large. Therefore, using the above color film layer 3 can avoid setting polarizers, which is beneficial for reducing the thickness of the display panel. Of course, as mentioned above, if the colors emitted by respective ones of the light-emitting devices 200 are the same, the color film layer 3 may also achieve the color display through the combination of the light-filtering portion 32 and the light-emitting functional layer 23.

The following describes the manner in which the display panel of the present disclosure realizes under-screen image capturing.

As shown in FIGS. 1 to 3, based on the display panel described above, the display area 101 of the driving backplane 1 may be divided into a plurality of sub-areas. Specifically, the display area 101 may include a first sub-area 1011 and a second sub-area 1012 that do not overlap with each other. The first sub-area 1011 may surround at least a part of the second sub-area 1012 and have an area larger than the second sub-area 1012. All of the pixel circuits of the driving backplane 1 may be located in the first sub-area 1011, while there is no pixel circuit in the second sub-area 1012. That is to say, the pixel circuits used for driving all of the light-emitting devices 200 are located in the first sub-area 1011. Meanwhile, in order to accommodate all of the pixel circuits in the first sub-area 1011 without increasing the size of the display panel, the size of at least a part of the pixel circuits may be compressed, thereby reducing the occupied space and accommodating all of the pixel circuits without affecting conductivity.

In some embodiments of the present disclosure, the pixel circuits of the driving backplane 1 may include a plurality of first pixel circuits and a plurality of second pixel circuits located in the first sub-area 1011. The number of the first pixel circuits is the same as the number of the light-emitting devices 200 located in the first sub-area 1011, and the number of the second pixel circuits is the same as the number of the light-emitting devices 200 located in the second sub-area 1012. Respective ones of the first pixel circuits are connected in one-to-one correspondence to respective ones of the light-emitting devices 200 located in the first sub-area 1011, and respective ones of the second pixel circuits are connected in one-to-one correspondence to respective ones of the light-emitting devices 200 located in the second sub-area 1012. Furthermore, in order to facilitate the connection of respective ones of the light-emitting devices 200 in the second sub-area 1012 with the second pixel circuits in the first sub-area 1011, an adapter layer may be set between the driving backplane 1 and the light-emitting layer 2. The adapter layer includes at least one wiring layer, and each wiring layer includes a plurality of transparent wire. Through the transparent wires, respective ones of the light-emitting devices 200 in the second sub-area 1012 are connected in one-to-one correspondence to the second pixel circuits.

Meanwhile, an orthographic projection, on the driving backplane 1, of at least a part of the first pixel circuits has a width in the row direction smaller than that of an orthographic projection, on the driving backplane 1, of the other parts of the first pixel circuits, causing that at least a part of the first pixel circuits is compressed in the row direction, thereby providing sufficient space for accommodating the second pixel circuits. Of course, the pixel circuits may also be compressed along the column direction, or other manners may be used for compressing the pixel circuits, as long as sufficient space is provided to accommodate all of the pixel circuits.

The row direction and the column direction are only two mutually perpendicular directions and are not limited to the horizontal and vertical directions in the accompanying drawings. Those skilled in the art can be aware that as the display panel rotates, the actual orientations of the row direction and the column direction may change.

As shown in FIG. 2 and FIG. 3, an area of the pixel definition layer 21 corresponding to the second sub-area 1012 is provided with a plurality of first light-transmitting holes 212. The light-shielding portion 31 of the color film layer 3 may be provided with a plurality of second light-transmitting holes 312. Respective ones of the second light-transmitting holes 312 and the first light-transmitting holes 212 are arranged in one-to-one correspondence in the direction perpendicular to the driving backplane 1. For example, the central axis of the first light-transmitting hole 212 and the central axis of the corresponding second light-transmitting hole 312 are collinear. Thus, a plurality of channels that allow external light to pass through are formed, causing that the imaging device can capture images, in the second sub-area 1012, from the side of the driving backplane 1 away from the color film layer 3, achieving the under-screen image capturing. Moreover, since there is no pixel circuit in the second sub-area 1012, the light can be avoided to be blocked by the pixel circuit, facilitating the imaging device to receive light, and improving the quality of the captured image.

Of course, since the first light-transmitting holes 212 and the second light-transmitting holes 312 form light-transmitting channels, those skilled in the art can be aware that in addition to achieving the under-screen image capturing in the second sub-area 1012, the second sub-area 1012 may also be used for achieving under-screen fingerprint recognition. A photoelectric sensing device for fingerprint recognition may be provided in the second sub-area 1012 of the driving backplane 1 or at the side of the driving backplane 1 away from the color film layer 3. Fingers are pressed on the side of the color film layer 3 away from the driving backplane 1, and after light emitted by the light-emitting device 200 is reflected by the fingers, the light may reach the photoelectric sensing device through the above channel, converting the optical signal into an electrical signal. Due to the difference in the reflection of light by the ridges and valleys of the fingerprint, a fingerprint image may be generated. After comparing the fingerprint image with the standard image, the fingerprint recognition can be achieved. The detailed principle of the fingerprint recognition will not be detailed here.

The pixel definition layer 21 may be made of a light-shielding material. For example, the material of the pixel definition layer 21 may include black resin or other materials. The pixel definition layer 21 can block the light emitted by the light-emitting devices 200 from reaching the imaging device, thereby reducing the interference of the light emitted by the light-emitting devices 200 on the imaging device and improving the quality of the captured image.

The sizes of the first light-transmitting hole 212 and the second light-transmitting hole 312 are not specially limited here, as long as they can form a light-transmitting channel. In some embodiments of the present disclosure, an orthographic projection, on the driving backplane 1, of any one of the first light-transmitting holes 212 is located within an orthographic projection, on the driving backplane 1, of a corresponding one of the second light-transmitting holes 312, causing that the first light-transmitting hole 212 is not larger than the corresponding second light-transmitting hole 312, avoiding the light-shielding portion 31 of the color film layer 3 from blocking the first light-transmitting hole 212.

In some embodiments of the present disclosure, a shape of an outline of an orthographic projection of the first light-transmitting hole 212 on the driving backplane 1 may be a smooth closed curve, such as a circle (as shown in FIG. 5), an oval (as shown in FIG. 6), or a capsular shape, etc., which can avoid problems such as light diffraction caused by an existence of a sharp angle in the circumferential direction of the first light-transmitting hole 212, and is conducive to improving the quality of the captured image. Of course, the outline of the orthographic projection of the first light-transmitting hole 212 on the driving backplane 1 may also be a polygon or other shapes. An outline of an orthographic projection of the second light-transmitting hole 312 on the driving backplane 1 may be in a same shape as the outline of the orthographic projection of the first light-transmitting hole 212 on the driving backplane 1.

Furthermore, as shown in FIGS. 4 to 6, due to the need for the imaging device to capture images through the second sub-area 1012, in order to prevent interference such as light diffraction caused by a sharp corner of the first electrode 22 located in the second sub-area 1012, an outline of an orthographic projection, on the driving backplane 1, of the first electrode 22 located in the second sub-area 1012 may be made to be a smooth closed curve described above, such as a circle, an oval, or a capsular shape, etc., in order to improve the quality of the captured image. Meanwhile, since the first sub-area 1011 is not used for the imaging device to capture images, no special limitations are made to the shape of the first electrode 22 in the first sub-area 1011, and the shape of the first electrode 22 in the first sub-area 1011 may be a polygon, a smooth closed curve, or other shapes.

In some embodiments of the present disclosure, as shown in FIGS. 4 to 6, an outline of an orthographic projection, on the driving backplane 1, of the opening 211 located in the second sub-area 1012 may be a smooth closed curve, and an outline of an orthographic projection, on the driving backplane 1, of the opening 211 located in the first sub-area 1011 may be a polygon. The sizes of different openings 211 may vary. The shapes of different openings 211 may also vary.

The following describes the distribution of the light-emitting devices 200 and the first light-transmitting holes 212.

As shown in FIGS. 2 to 6, in some embodiments of the present disclosure, the light-emitting devices 200 may be divided into a plurality of device groups 20, and each of the device groups 20 includes more than one of the light-emitting devices 200. The number of the light-emitting devices 200 in different device groups 20 is the same. Both of the first sub-area 1011 and the second sub-area 1012 are provided with more than one of the device groups 20. At least one of the device groups 20 in the second sub-area 1012 is surrounded by more than one of the first light-transmitting holes 212. For example, each of the device groups 20 in the second sub-area 1012 is surrounded by more than one of the first light-transmitting holes 212, that is, all the openings 211 of each device group 20 are located within a range surrounded by more than one of the first light-transmitting holes 212. A part of the first light-transmitting holes 212 surrounding any one of the device groups 20 may be simultaneously used for surrounding an adjacent device group 20. No first light-transmitting hole 212 may be set among the light-emitting devices 200 of the device group 20.

As shown in FIGS. 2 to 6, in some embodiments of the present disclosure, each device group 20 may include a first light-emitting device 200R, a second light-emitting device 200B, and two third light-emitting devices 200G. The opening 211 includes a first opening 211R corresponding to the first light-emitting device 200R. The opening 211 includes a second opening 211B corresponding to the second light-emitting device 200B. The opening 211 includes a third opening 211G corresponding to the third light-emitting device 200G.

The light-filtering portion 32 includes a first light-filtering portion 32R corresponding to the first light-emitting device 200R. A color of the first light-filtering portion 32R is red, used for transmitting red light. The first light-filtering portion 32R and the first light-emitting device 200R form a red light-emitting unit. The light-filtering portion 32 includes a second light-filtering portion 32B corresponding to the second light-emitting device 200B. A color of the second light-filtering portion 32B is blue, and used for transmitting blue light. The second light-filtering portion 32B and the second light-emitting device 200B form a blue light-emitting unit. The light-filtering portion 32 includes a third light-filtering portion 32G corresponding to the third light-emitting device 200G. A color of the third light-filtering portion 32G is green, and used for transmitting green light. The third light-filtering portion 32G and two third light-emitting devices 200G form two green light-emitting units.

As shown in FIGS. 4 to 6, the first opening 211R may be larger than the second opening 211B, and the second opening 211B may be larger than the third opening 211G. That is to say, in a device group 20, an emission range of the red light-emitting unit is larger than that of the blue light-emitting unit, and an emission range of the blue light-emitting unit is larger than that of any one of the green light-emitting units.

All the light-emitting units formed by one device group 20 may be used as one pixel to display the image, but two adjacent device groups 20 may also share a part of the light-emitting units thereof, resulting in a larger number of the pixels than the number of the device groups 20. The image may be displayed through sub-pixel rendering (SPR), thereby increasing the resolution of the displayed image without increasing the number of the light-emitting units. The specific principle of the SPR will not be detailed here.

In addition, as shown in FIGS. 2 and 3, in some embodiments of the present disclosure, the display panel of the present disclosure may further include an encapsulation layer 4 and a touch layer 5.

The encapsulation layer 4 covers a surface of the light-emitting layer 2 away from the driving backplane 1, and may be used for protecting the light-emitting layer 2 and preventing external water and oxygen from corroding the light-emitting devices 200.

In some embodiments of the present disclosure, thin-film encapsulation (TFE) may be used to achieve encapsulation. Specifically, the encapsulation layer 4 may include a first inorganic layer, an organic layer, and a second inorganic layer. The first inorganic layer covers the surface of the light-emitting layer 2 away from the driving backplane 1, and the organic layer may be located on a surface of the first inorganic layer away from the driving backplane 1. A boundary of the organic layer is limited to an inner side of a boundary of the first inorganic layer. The second inorganic layer covers the organic layer and the first inorganic layer that is not covered by the organic layer. The invasion of water and oxygen may be blocked by the second inorganic layer, and the planarization may be achieved through the flexible organic layer.

As shown in FIGS. 2 and 3, the touch layer 5 may be located at one side of the encapsulation layer 4 away from the driving backplane 1 to sense user touch operations and interact with the user through the image displayed on the display panel. The color film layer 3 may be located at one side of the touch layer 5 away from the driving backplane 1.

In some embodiments of the present disclosure, taking mutual capacitive touch as an example, the touch layer 5 may include a first touch electrode and a second touch electrode. The first touch electrode and the second touch electrode may be cross distributed in space along a first direction and a second direction perpendicular to each other, thereby determining the touch position by sensing capacitance changes between the first touch electrode and the second touch electrode.

In addition, as shown in FIGS. 2 and 3, the display panel of the present disclosure may further include a transparent cover 6. The transparent cover 6 may be located at one side of the touch layer 5 away from the driving backplane 1. The transparent cover 6 may be made of glass or other transparent materials.

In addition, as shown in FIGS. 2 and 3, the display panel of the present disclosure may further include a plurality of support columns 7. The support columns 7 are located on a surface of the pixel definition layer 21 away from the driving backplane 1, and are distributed in the display area 101. For example, the support columns 7 are distributed in both the first sub-area 1011 and the second sub-area 1012; and the support column 7 in the second sub-area 1012 is located outside the opening 211 and the first light-transmitting hole 212, that is to say, an orthogonal projection of the support column 7 on the pixel definition layer 21 is located outside the opening 211 and the first light-transmitting hole 212. No special limitations are made to the materials of the support columns 7, for example, the support columns 7 may be made of transparent resin or other transparent materials. Thicknesses of respective ones of the support columns 7 are the same to avoid tilting of the mask plate, and no special limitations are made to the specific thicknesses here. In addition, the second electrode 24 covers the support columns 7, and areas of the second electrode 24 corresponding to the support columns 7 protrude.

When forming the light-emitting functional layer 23 and the second electrode 24, the support columns 7 are used for supporting the mask plate used when forming the light-emitting functional layer 23 by using the evaporation process.

Of course, if the support columns 7 are made of transparent materials, a part of the support columns 7 may be located inside the first light-transmitting hole 212, but it should be ensured that surfaces of respective ones of the support columns 7 away from the driving backplane 1 are located in the same plane to support the mask plate. Therefore, the thickness of the support column 7 inside the first light-transmitting hole 212 is greater than the thickness of the support column 7 outside the first light-transmitting hole 212.

An embodiment of the present disclosure provides a manufacturing method for a display panel, and the structure of the display panel may refer to the embodiments of the display panel described above, which will not be detailed here. As shown in FIG. 7, the manufacturing method may include steps S110 to S130.

At step S110, a driving backplane 1 is formed, and the driving backplane 1 is provided with a display area including a first sub-area and a second sub-area.

At step S120, a light-emitting layer is formed at one side of the driving backplane 1, the light-emitting layer includes a pixel definition layer and a plurality of light-emitting devices separated by the pixel definition layer, the pixel definition layer covers the first sub-area and the second sub-area, and respective ones of the light-emitting devices are distributed in the first sub-area and the second sub-area; and the pixel definition layer is made of a light-shielding material and provided with a plurality of first light-transmitting holes located in the second sub-area.

At step S130, a color film layer is formed at one side of the light-emitting layer away from the driving backplane 1, the color film layer includes a light-shielding portion and a plurality of light-filtering portions separated by the light-shielding portion; the light-filtering portions and the light-emitting devices are arranged in one-to-one correspondence in a direction perpendicular to the driving backplane 1; the light-shielding portion is provided with a plurality of second light-transmitting holes, and the second light-transmitting holes and the first light-transmitting holes are arranged in one-to-one correspondence in a direction perpendicular to the driving backplane 1.

Furthermore, in combination with the embodiments of the display panel described above, at step S120, the openings and first light-transmitting holes of the pixel definition layer may be formed simultaneously through one patterning process to simplify the process. For example, the black photoresist may be used for the pixel definition layer, and a pixel definition layer with the openings and the first light-transmitting holes may be obtained through coating, exposure, and development processes.

At step S130, when forming the color film layer, the light-shielding portion and the open holes on the light-shielding portion may be formed first, and the specific process may be the same as that of the pixel definition layer. Then the light-filtering portions may be formed at the open holes. The materials of the light-filtering portions of different colors are different, and the light-filtering portions of the same color may be formed simultaneously.

The details of each step of the manufacturing method in the embodiments of present disclosure may refer to the embodiments of the display panel, and the structures involved in each step have been described in detail and will not be further elaborated here.

It should be noted that although the various steps of the manufacturing method in the present disclosure are described in a specific order in the accompanying drawings, this does not require or imply that these steps must be executed in that specific order, or that all shown steps must be executed to achieve the desired results. Additionally or alternatively, some steps may be omitted, multiple steps may be merged into one step for execution, and/or a step may be decomposed into multiple steps for execution.

As shown in FIG. 8, an embodiment of the present disclosure also provides a display apparatus including a display panel 001, the display panel 001 may be the display panel of any of the above-described embodiments, and the specific structure and beneficial effects thereof may be referred to the above embodiments of the display panel, and will not be repeated herein. The display apparatus of the present disclosure may be an electronic device such as a cellular phone, a tablet computer, a television, and so on, and will not be enumerated herein.

In addition, the display apparatus may further include an imaging device 002, and the imaging device 002 may be located at one side of the driving backplane away from the color film layer and is located opposite to the second sub-area 1012, i.e., an orthographic projection of the imaging device 002 on the driving backplane at least partially coincides with the second sub-area 1012, e.g., the orthographic projection of the imaging device 002 on the driving backplane is located in the second sub-area 1012. Since the second sub-area 1012 corresponds to channels formed by the first light-transmitting holes and the second light-transmitting holes, external light at one side of the color film layer away from the driving backplane can reach the imaging device through the channels, thereby forming a captured image and realizing the under-screen image capturing.

After considering the specifications and practicing the present disclosure, those skilled in the art will easily come up with other embodiments of the present disclosure. The purpose of the present disclosure is to cover any variations, uses, or adaptations of the present disclosure, which follow the general principles of the present disclosure and include common knowledge or commonly used technical means in the technical field that are not disclosed in the present disclosure. The specification and embodiments are only considered exemplary, and the true scope and spirit of the present disclosure are indicated by the accompanying claims.

What is claimed is:

1. A display panel, comprising:

a driving backplane, provided with a display area, wherein the display area comprises a first sub-area and a second sub-area;

a light-emitting layer, located at one side of the driving backplane, and comprising a pixel definition layer and a plurality of light-emitting devices separated by the pixel definition layer, wherein the pixel definition layer covers the first sub-area and the second sub-area, the light-emitting devices are distributed in the first sub-area and the second sub-area, and the pixel definition layer is made of a light-shielding material and provided with a plurality of first light-transmitting holes located in the second sub-area; and a color film layer, located at one side of the light-emitting layer away from the driving backplane, and comprising a light-shielding portion and a plurality of light-filtering portions separated by the light-shielding portion, wherein the light-filtering portions and the light-emitting devices are arranged in one-to-one correspondence in a direction perpendicular to the driving backplane, the light-shielding portion is provided with a plurality of second light-transmitting holes, and the second light-transmitting holes and the first light-transmitting holes are arranged in one-to-one correspondence in the direction perpendicular to the driving backplane; wherein the light-emitting device comprises: a first electrode, located at one side of the driving backplane close to the color film layer, wherein the pixel definition layer is provided with an opening exposing the first electrode; and an outline of an orthographic projection, on the driving backplane, of the opening in the first sub-area is a polygon, and an outline of an orthographic projection, on the driving backplane, of the opening in the second sub-area is a smooth closed curve.

2. The display panel according to claim 1, wherein the display panel comprises a plurality of device groups, and each of the device groups comprises more than one of the light-emitting devices; and at least one of the device groups in the second sub-area is surrounded by more than one of the first light-transmitting holes.

3. The display panel according to claim 1, wherein an outline of an orthographic projection of the first light-transmitting hole on the driving backplane is a smooth closed curve.

4. The display panel according to claim 3, wherein the outline of the orthographic projection of the first light-transmitting hole on the driving backplane is any one of a circle, an oval, or a capsular shape.

5. The display panel according to claim 1, wherein an outline of an orthographic projection of the second light-transmitting hole on the driving backplane is in a same shape as an outline of an orthographic projection of the first light-transmitting hole on the driving backplane.

6. The display panel according to claim 1, wherein an orthographic projection, on the driving backplane, of any one of the first light-transmitting holes is located within an orthographic projection, on the driving backplane, of a corresponding one of the second light-transmitting holes.

7. The display panel according to claim 1, wherein the light-emitting device further comprises:

a light-emitting functional layer, at least partially located in the opening and located on a surface of the first electrode away from the driving backplane; and a second electrode, located on a surface of the light-emitting functional layer away from the driving backplane.

8. The display panel according to claim 7, wherein the second electrode is a continuous electrically conductive layer covering the light-emitting functional layer and the pixel definition layer, the light-emitting devices share the same second electrode, and an area of the second electrode corresponding to the first light-transmitting hole is recessed into the first light-transmitting hole.

9. The display panel according to claim 1, wherein the driving backplane comprises a plurality of first pixel circuits and a plurality of second pixel circuits located in the first sub-area; and respective ones of the first pixel circuits are connected in one-to-one correspondence to respective ones of the light-emitting devices located in the first sub-area, and respective ones of the second pixel circuits are connected in one-to-one correspondence to respective ones of the light-emitting devices located in the second sub-area.

10. The display panel according to claim 7, wherein the display panel comprises a plurality of device groups, and each of the device groups comprises a first light-emitting device, a second light-emitting device, and two third light-emitting devices; the opening comprises a first opening corresponding to the first light-emitting device, a second opening corresponding to the second light-emitting device, and a third opening corresponding to the third light-emitting device; the first opening is larger than the second opening, and the second opening is larger than the third opening; and the light-filtering portion comprises a first light-filtering portion corresponding to the first light-emitting device, a second light-filtering portion corresponding to the second light-emitting device, and a third light-filtering portion corresponding to the third light-emitting device; a color of the first light-filtering portion is red, a color of the second light-filtering portion is blue, and a color of the third light-filtering portion is green.

11. The display panel according to claim 1, wherein the display panel further comprises:

an encapsulation layer, covering a surface of the light-emitting layer away from the driving backplane; and a touch layer, located at one side of the encapsulation layer away from the driving backplane; wherein the color film layer is located at one side of the touch layer away from the driving backplane.

12. A manufacturing method for a display panel, comprising:

forming a driving backplane, wherein the driving backplane is provided with a display area, and the display area comprises a first sub-area and a second sub-area;

forming a light-emitting layer at one side of the driving backplane, wherein the light-emitting layer comprises a pixel definition layer and a plurality of light-emitting devices separated by the pixel definition layer, the pixel definition layer covers the first sub-area and the second sub-area, and respective ones of the light-emitting devices are distributed in the first sub-area and the second sub-area; and the pixel definition layer is made of a light-shielding material and provided with a plurality of first light-transmitting holes located in the second sub-area; and forming a color film layer at one side of the light-emitting layer away from the driving backplane, wherein the color film layer comprises a light-shielding portion and a plurality of light-filtering portions separated by the light-shielding portion; the light-filtering portions and the light-emitting devices are arranged in one-to-one correspondence in a direction perpendicular to the driving backplane; the light-shielding portion is provided with a plurality of second light-transmitting holes, and the second light-transmitting holes and the first light-transmitting holes are arranged in one-to-one correspondence in a direction perpendicular to the driving backplane; wherein the light-emitting device comprises: a first electrode, located at one side of the driving backplane close to the color film layer, wherein the pixel definition layer is provided with an opening exposing the first electrode; and an outline of an orthographic projection, on the driving backplane, of the opening in the first sub-area is a polygon, and an outline of an orthographic projection, on the driving backplane, of the opening in the second sub-area is a smooth closed curve.

13. A display apparatus, comprising a display panel, wherein the display panel comprises:

a driving backplane, provided with a display area, wherein the display area comprises a first sub-area and a second sub-area;

a light-emitting layer, located at one side of the driving backplane, and comprising a pixel definition layer and a plurality of light-emitting devices separated by the pixel definition layer, wherein the pixel definition layer covers the first sub-area and the second sub-area, the light-emitting devices are distributed in the first sub-area and the second sub-area, and the pixel definition layer is made of a light-shielding material and provided with a plurality of first light-transmitting holes located in the second sub-area; and a color film layer, located at one side of the light-emitting layer away from the driving backplane, and comprising a light-shielding portion and a plurality of light-filtering portions separated by the light-shielding portion, wherein the light-filtering portions and the light-emitting devices are arranged in one-to-one correspondence in a direction perpendicular to the driving backplane, the light-shielding portion is provided with a plurality of second light-transmitting holes, and the second light-transmitting holes and the first light-transmitting holes are arranged in one-to-one correspondence in the direction perpendicular to the driving backplane; wherein the light-emitting device comprises: a first electrode, located at one side of the driving backplane close to the color film layer, wherein the pixel definition layer is provided with an opening exposing the first electrode; and an outline of an orthographic projection, on the driving backplane, of the opening in the first sub-area is a polygon, and an outline of an orthographic projection, on the driving backplane, of the opening in the second sub-area is a smooth closed curve.

14. The display apparatus according to claim 13, wherein the display panel comprises a plurality of device groups, and each of the device groups comprises more than one of the light-emitting devices; and at least one of the device groups in the second sub-area is surrounded by more than one of the first light-transmitting holes.

15. The display apparatus according to claim 13, wherein an outline of an orthographic projection of the first light-transmitting hole on the driving backplane is a smooth closed curve.

16. The display apparatus according to claim 15, wherein the outline of the orthographic projection of the first light-transmitting hole on the driving backplane is any one of a circle, an oval, or a capsular shape.

17. The display apparatus according to claim 13, wherein an outline of an orthographic projection of the second light-transmitting hole on the driving backplane is in a same shape as an outline of an orthographic projection of the first light-transmitting hole on the driving backplane.

18. The display apparatus according to claim 13, wherein an orthographic projection, on the driving backplane, of any one of the first light-transmitting holes is located within an orthographic projection, on the driving backplane, of a corresponding one of the second light-transmitting holes.

19. The display apparatus according to claim 13, wherein the light-emitting device further comprises:

a light-emitting functional layer, at least partially located in the opening and located on a surface of the first electrode away from the driving backplane; and a second electrode, located on a surface of the light-emitting functional layer away from the driving backplane.

* * * * *